(12) United States Patent
Cowley et al.

(10) Patent No.: US 9,397,566 B2
(45) Date of Patent: Jul. 19, 2016

(54) MASTER-SLAVE DIGITAL VOLTAGE REGULATORS

(71) Applicants: Nicholas P. Cowley, Wroughton (GB); Harish K. Krishnamurthy, Hillsboro, OR (US); Ruchir Saraswat, Swindon (GB)

(72) Inventors: Nicholas P. Cowley, Wroughton (GB); Harish K. Krishnamurthy, Hillsboro, OR (US); Ruchir Saraswat, Swindon (GB)

(73) Assignee: Intel Corporation, Santa Clara, CA (US)

( * ) Notice: Subject to any disclaimer, the term of this patent is extended or adjusted under 35 U.S.C. 154(b) by 89 days.

(21) Appl. No.: 14/220,881

(22) Filed: Mar. 20, 2014

(65) Prior Publication Data

US 2015/0270777 A1    Sep. 24, 2015

(51) Int. Cl.
*G05F 1/00* (2006.01)
*H02M 3/158* (2006.01)
*H02M 3/157* (2006.01)
*H02M 1/00* (2006.01)

(52) U.S. Cl.
CPC .............. *H02M 3/158* (2013.01); *H02M 3/157* (2013.01); *H02M 2001/008* (2013.01)

(58) Field of Classification Search
CPC . H02M 3/1588; H02M 3/1584; H02M 3/156; H02M 3/157; H02M 7/08; H02M 7/493; H02J 1/102; G06F 1/3203

USPC ........ 323/271, 272, 282–285; 363/65, 69, 71, 363/72; 307/43, 82; 713/300, 310, 320
See application file for complete search history.

(56) References Cited

U.S. PATENT DOCUMENTS

| | | | |
|---|---|---|---|
| 4,174,534 A | 11/1979 | Kotlarewsky | |
| 6,157,093 A | 12/2000 | Giannopoulos | |
| 2004/0246754 A1* | 12/2004 | Chapuis | H02J 1/08 363/89 |
| 2007/0069706 A1 | 3/2007 | Chapuis et al. | |
| 2008/0238393 A1* | 10/2008 | Potter | G06F 1/26 323/283 |
| 2010/0225287 A1 | 9/2010 | Schultz | |
| 2012/0074581 A1 | 3/2012 | Guzek | |

OTHER PUBLICATIONS

PCT Application No. PCT/US2015/014854, International Search Report, May 15, 2015, 11 pages.

* cited by examiner

*Primary Examiner* — Nguyen Tran
(74) *Attorney, Agent, or Firm* — Blakely, Sokoloff, Taylor & Zafman LLP (57) ABSTRACT

Described is an apparatus which comprises: a first bridge to be coupled to a first load; a first Pulse Width Modulation (PWM) circuit to drive the first bridge; a second bridge to be coupled to a second load; and a second PWM circuit to drive the second bridge, wherein the first PWM circuit is controlled by a first digital word separate from a second digital word, wherein the second PWM circuit is controlled by the second digital, and wherein the second digital word is derived from the first digital word.

11 Claims, 6 Drawing Sheets

MASTER-SLAVE DIGITAL VOLTAGE REGULATORS

BACKGROUND

Known switched mode voltage regulators (VRs) may use digital controllers to generate the required load voltage from the input line voltage. The digital controllers include an input sampler implemented as an Analog-to-Digital Converter (ADC), a digital control loop controller, and a digitally implemented Pulse Width Modulation (PWM) generator, for example, using a digitally controllable delay line. Disadvantageously, each VR instantiation may either require an independent controller each with associated area and power overhead or alternately a smaller number of interleaved controllers may be deployed. In interleaved controllers, a single controller cycles between two or more voltage domains with the disadvantage of increased power from the 'N' sampling and clocking operations, where 'N' is the number of interleaved VRs.

In advanced deep sub-micron technologies, the area associated with the digital controller may be small, however, since ADCs rely on analog circuits, which do not scale to Moore's Law, they disadvantageously lead to an increased area and hence cost overhead. The interleaving approach additionally can be problematic to implement on advanced deep submicron process nodes due to the routing congestion and impedances associated with interconnect between local power islands and the time interleaved ADC, which may lead to error in the monitored voltage.

So conventional multiple controller instantiations (i.e., 'N'instantiations) may be burdened with the power and area associated with 'N' ADCs and controllers, all running at 8×VR switching frequency (which may be in excess of 1 GHz for advanced controllers) or with a smaller number of time interleaved ADCs and controllers running at greater than 'M' GHz, where 'M' is the number of interleaved controllers. For example, embedded VRs may desirably run at a clock rate greater than 100 MHz and the ADC, and hence controller, may desirably run at a minimum of 8 times the oversampling frequency leading to high ADC and controller clock frequencies. These high frequencies result in high dynamic power consumption.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Some embodiments utilize the PWM control data generated within the digital controller of a first VR (i.e., Master VR) to set the output voltage of one or more further VRs (i.e., Slave VR(s)) through direct control of the Slave VRs' power train(s) (also referred here as bridges). In one embodiment, digital voltage scaling is applied to the PWM control word to accommodate differences in load voltage and/or current, and/or component tolerance. In one embodiment, correlation/calibration features may be included to improve accuracy.

In one embodiment, an apparatus is provided which comprises: a first bridge (e.g., first power train) to be coupled to a first load (e.g., processor core); a first PWM circuit to drive the first bridge; a second bridge to be coupled to a second load (e.g., another processor core); and a second PWM circuit to drive the second bridge, wherein the first PWM circuit is controlled by a first digital word different from a second digital word, wherein the second PWM circuit is controlled by the second digital word, and wherein the second digital word is derived from the first digital word.

There are many technical effects of the embodiments. One non-limiting technical effect is that for solutions with multiple independent voltage domains, some embodiments reduce the area and power overhead associated with prior art. Some embodiments may also reduce the need for digital controllers and/or ADCs on non-ideal process nodes.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFET transistors, Gate All Around Cylindrical Transistors or other devices implementing transistor functionality like carbon nanotubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 1:
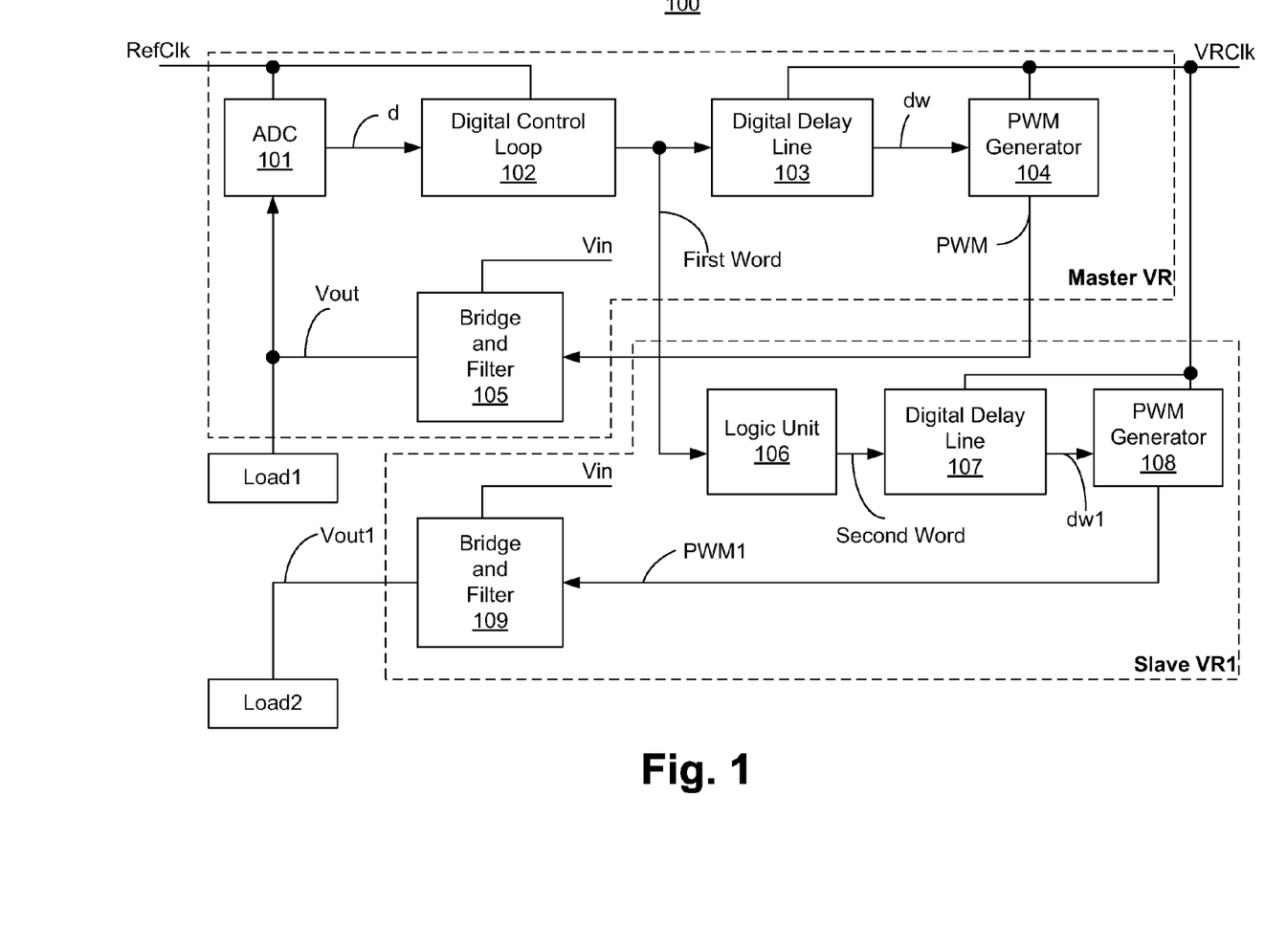
FIG. 1 illustrates master-slave architecture to provide multiple regulated power supplies, according to one embodiment of the disclosure.

FIG. 1 illustrates master-slave architecture 100 to provide multiple regulated power supplies, according to one embodiment of the disclosure. In one embodiment, architecture 100 comprises ADC 101, Digital Control Loop controller 102, Digital Delay Line 103, PWM Generator 104, Bridge and Filter 105, Logic Unit 106, Digital Delay Line 107, PWM Generator 108, and Bridge and Filter 109. In this embodiment, master-slave architecture 100 is a switched mode buck regulator that provides regulated voltages Vout and Vout1 to Load1 and Load2, respectively. In one embodiment, ADC 101, Digital Control Loop controller 102, Digital Delay Line 103, PWM Generator 104, and Bridge and Filter 105 together form a Master VR, while Logic Unit 106, Digital Delay Line 107, PWM Generator 108, and Bridge and Filter 109 form a Slave VR1. In one embodiment, Logic Unit 106 is part of the Master VR.

In one embodiment, output Vout of Bridge and Filter 105 is received by ADC 101 which converts the analog voltage Vout to a digital representation 'd.' In one embodiment, the digital representation 'd' of Vout is then processed by Digital Control Loop controller 102. In one embodiment, Digital Control Loop controller 102 receives Reference Clock (RefClk) and programming data (not shown) which among other parameters programs the desired load voltage represented as digital word i.e., First Word. In one embodiment, ADC 101 also operates using RefClk. In one embodiment, Digital Control Loop controller 102 adjusts a programmable delay applied to the VR Clock (VRClk) whose delayed output is then compared in time against the root clock to generate a PWM signal by PWM Generator 104. In one embodiment, frequency of VRClk is much slower than frequency of RefClk. In one embodiment, the mark-space ratio (MS ratio) of the PWM signal is set by the First word. Here, MS ratio indicates the duty cycle of the PWM signal. By changing the MS ratio, voltage level of Vout is adjusted. The PWM signal controls the power train (i.e., Bridge) to generate Vout to close the loop. This loop forms the Master VR.

In one embodiment, Digital Control Loop controller 102 adjusts the MS ratio of the PWM signal such that Vout (which is represented by digital word 'd') substantially equals the commanded voltage set by the programmed data word. Digital Control Loop controller 102 can be implemented in a variety of ways and can provide features such as soft start, over voltage detection, etc. In one embodiment, Bridge and Filter 105 includes p-type high-side switch coupled in series with an n-type low-side switch, where the two switches are controlled by PWM signal. In one embodiment, Bridge and Filter 105 further includes an inductor with a first end coupled to the high-side and low-side switches, and a capacitor coupled to a second end of the inductor and the ground. In one embodiment, the common junction of the inductor and the capacitor is coupled to the output voltage node Vout. Here, labels for signals and nodes are interchangeably used. For example, Vout may refer to node Vout or signal Vout depending on the context of the sentence.

An input voltage (Vin) is received by the high-side switch and a regulated output voltage Vout is provided by turning ON/OFF the high-side and low-side switches by the PWM signal. For example, part of the PWM signal turns ON the high-side switch and the remaining part of the PWM signal turns ON the low-side switch. In one embodiment, switching of the bridge may be arranged to avoid shoot through on Vout where both high-side and low-side switches are ON at the same time.

While the embodiments are described with reference to a buck converter, they are not limited to such. In one embodiment, architecture 100 is applicable for a boost converter. The embodiments may also be applicable to switched mode step up or down regulation where output regulated voltage (e.g., Vout and Vout1) are controlled by an analog or digital PWM signal. For example, when architecture 100 is used for a boost converter, Vout and Vin are swapped.

In one embodiment, architecture further comprises the Slave VR1 which provides another regulated output voltage Vout1 for Load2 by sharing hardware of the Master VR. In one embodiment, a known relationship (here referred as 'K') between Vout and the First Word can be determined when the input voltage Vin is known. In such an embodiment, 'K' is used by Logic Unit 106 to generate the Second Word. In one embodiment, the Second Word is used to adjust delay of VRClk to generate dw1 signal for PWM Generator 108. In one embodiment, PWM Generator 108 generates another PWM signal (here, PWM1 signal) for controlling Bridge and Filter 109 to generate regulated output voltage Vout1 for Load2. Here, since both 'K' and the commanded voltage (i.e., Vout which is the desired voltage) of a further rail (i.e., supply rail to provide supply voltage to the circuit block) are both known, then the First Word may be fed into a slave regulator digital delay line to control the load voltage of the second regulator.

In one embodiment, the Second Word is adjusted by Logic Unit 106 according to voltage ratio between Slave VR1 (i.e., $V_{SLAVE}$) and Master VR ($V_{MASTER}$). In one embodiment, Logic Unit 106 generates the Second Word according to $V_{SLAVE}/V_{MASTER}*K$. Here, $V_{SLAVE}$ is Vout1 and $V_{MASTER}$ is Vout. In one embodiment, the Second Word (i.e., the modified First Word) is used to control Digital Delay Line 107. In one embodiment, Digital Delay Lines 103 and 107 are matched delay lines i.e., they have identical designs and layout. While the embodiment of FIG. 1 shows one Slave VR1 cascaded with the Master VR, multiple Slave VRs can be cascaded to generate local regulated voltages for their respective load circuits. In one embodiment, when the two output voltages (i.e., Vout and Vout1) are the same, then the First and Second Words may also be the same.

Figure 2:
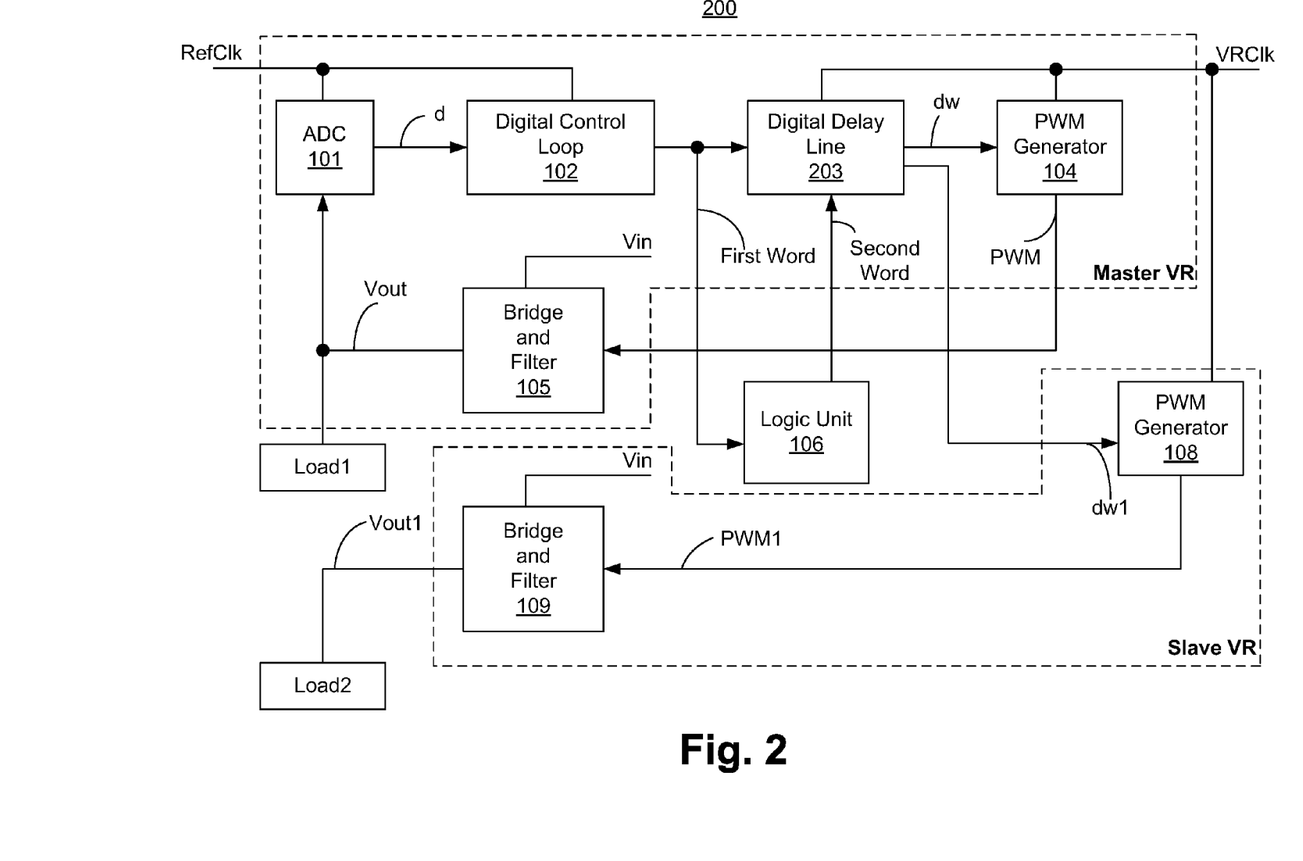
FIG. 2 illustrates master-slave architecture with shared delay line, according to one embodiment of the disclosure.

FIG. 2 illustrates master-slave architecture 200 with a shared delay line, according to one embodiment of the disclosure. It is pointed out that those elements of FIG. 2 having the same reference numbers (or names) as the elements of any other figure can operate or function in any manner similar to that described, but are not limited to such. So as not to obscure the embodiments of FIG. 2, differences between FIG. 1 and FIG. 2 are described.

In this embodiment, Digital Delay Lines 103 and 107 are combined in a single delay line (i.e., shared delay line) which is operable to generate delayed versions of VRClk as "dw" and "dw1" signals according to the First and Second Words, respectively. In one embodiment, the First Word is received as multiplexer select signal in Digital Delay Line 203 which causes a selection of a first delay path from Digital Delay Line 203 to generate "dw." In one embodiment, the Second Word is received as multiplexer select signal in Digital Delay Line 203 which causes a selection of a second delay path from Digital Delay Line 203 to generate "dw1." One technical effect of this embodiment is that the Slave VR is smaller in size than the Slave VR1 of FIG. 1. Referring back to FIG. 2, the communication between the Slave VR and the Master VR uses digital signals (e.g., Second Word, VRClk, etc.). These digital signals allow the Slave VR to be placed at far distances away from the Master VR with little or no impact on the regulation characteristics of the Slave VR.

Figure 3:
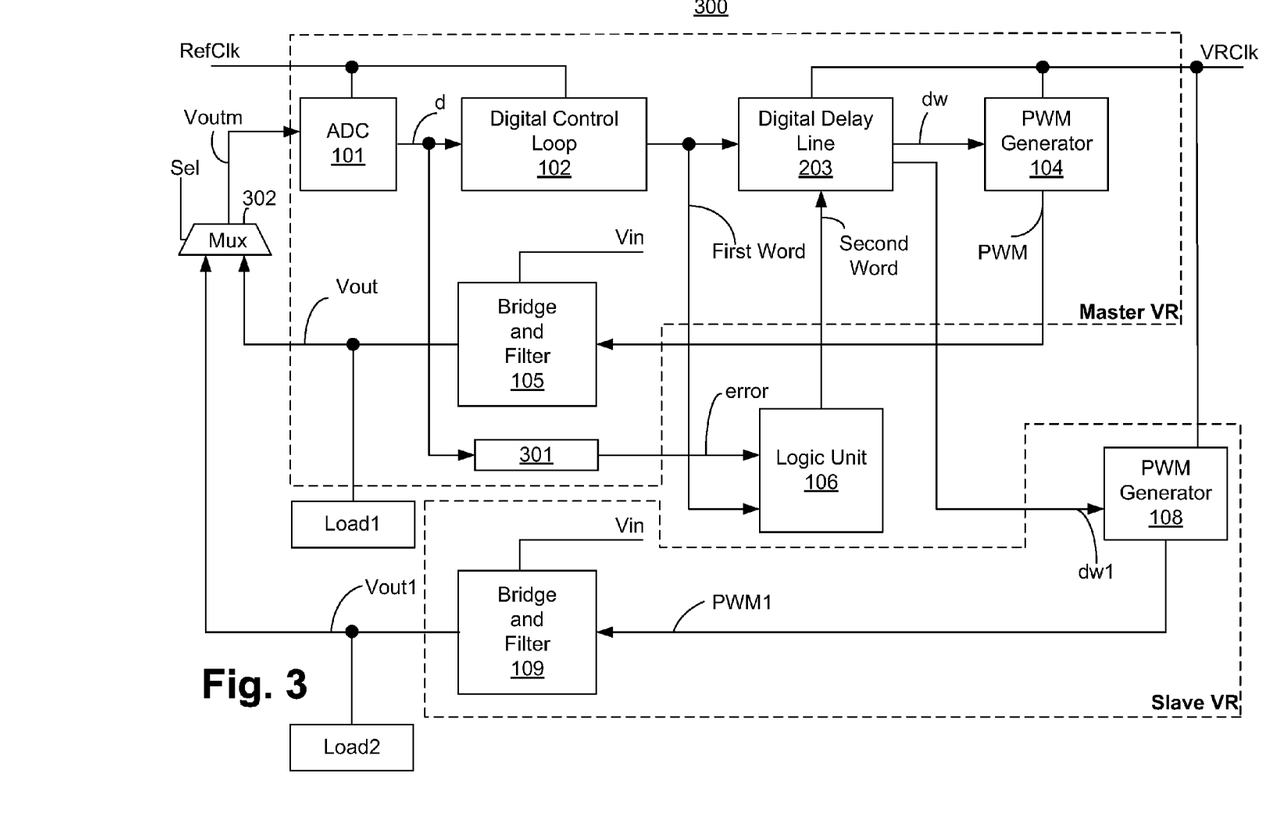
FIG. 3 illustrates master-slave architecture with calibration and single time interleaved ADC, according to one embodiment of the disclosure.

FIG. 3 illustrates master-slave architecture 300 with calibration and single time interleaved ADC, according to one embodiment of the disclosure. It is pointed out that those elements of FIG. 3 having the same reference numbers (or names) as the elements of any other figure can operate or function in any manner similar to that described, but are not limited to such. So as not to obscure the embodiments, difference between FIGS. 1-2 and FIG. 3 are described.

In one embodiment, the Second Word may include a calibration factor ("error") to compensate for any systematic system offsets between the Master VR and the Slave VR determined during a calibration stage. These systematic differences may arise as a result of impedance differences between the Slave and Master implementations. For example, 1 mOhm difference in impedance between the power stage and the load may result in 1 mV of voltage offset when there is a difference in current of 1 A. In one embodiment, these systematic effects can be mitigated by designing slave and master VRs to match as closely as possible (i.e., having substantially identical designs and layout for Bridge and Filters).

In one embodiment, architecture 300 comprises calibration unit 301 and multiplexer (Mux) 302 in addition to the components discussed with reference to FIGS. 1-2. In one embodiment, Mux 302 receives regulated voltages from respective Bridges. For example, Mux 302 receives Vout and Vout1 from Bridge and Filter units 105 and 109, respectively. In one embodiment, Mux 302 selectively provides an output Voutm to ADC 101. In this embodiment, ADC 101 is time interleaved between Master VR and Slave VR such that Vout (i.e., master output voltage sample) is used to control the Master VR loop while Vout1 (i.e., slave output voltage sample) is used to calculate the adjustment to the First Word. In one embodiment, the time interleaving is performed by the select (Sel) signal to Mux 302.

One technical effect of the time interleaved ADC 101 is that compared to known interleaved control loops, where 'N' number of VRs share a common controller running at 'N' times the operating frequency, here Digital control Loop 102 continues to operate at RefClk frequency which is much slower than the VRClk frequency. By operating Digital control loop 102 at RefClk frequency, power consumption for that block remains unchanged.

While architecture 300 is illustrated with a single Slave VR which is time interleaved with Master VR, multiple Slave VRs may be used. In such an embodiment, a multiple input multiplexer (instead of 2:1 Mux 302) is used, and the select (Sel) signal causes the respective Vouts to be provided to ADC 101. In one such embodiment, ADC 101 may operate faster than RefClk, by a factor determined by the number of samples per VRClk cycle required by the Slave VRs. In another embodiment the number of samples may be unaltered.

Figure 4:
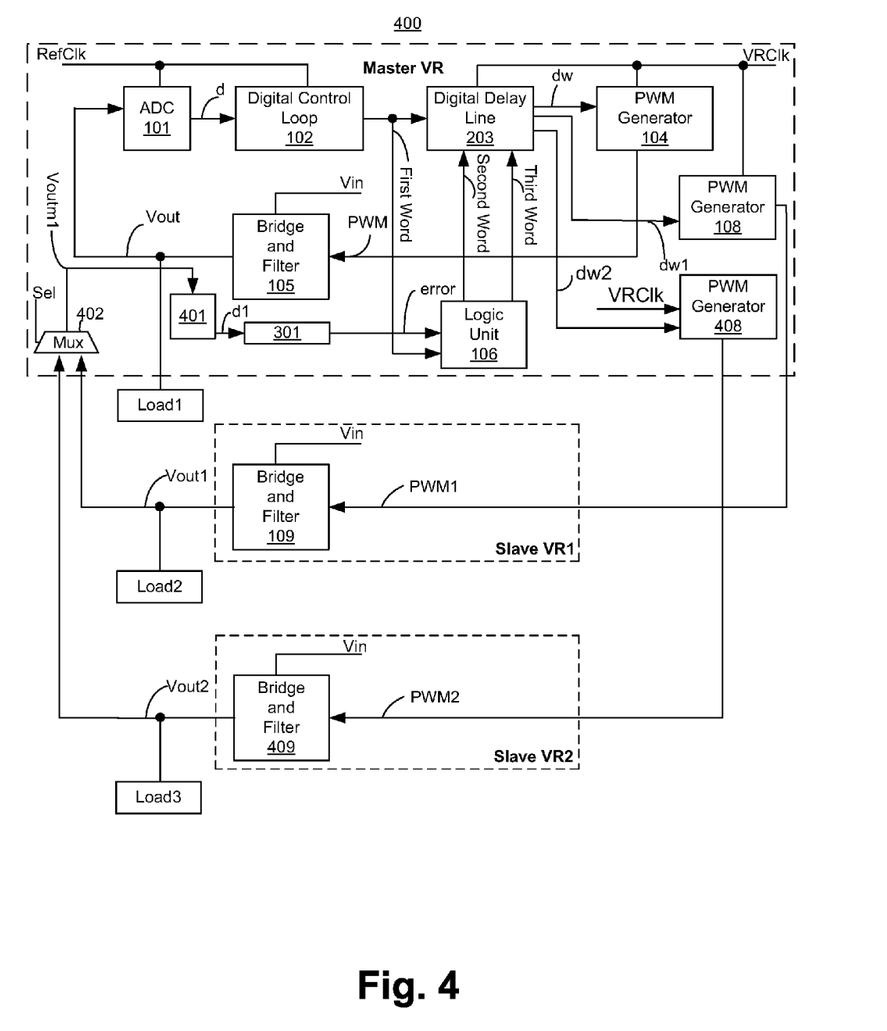
FIG. 4 illustrates master-slave architecture with calibration and time interleaved slow ADC, according to one embodiment of the disclosure.

For example, eight ADC samples may be used for the master VR control loop for one cycle of the switching regulator VRClk, whereas for the Slave VR(s) correction loop less than one sample per switching cycle may be used as the correction loop(s) are responsive to slowly varying changes, for example, systematic error. In one embodiment, Slave voltage Vout1 may be sampled between once every 10 and once every 100 switching cycles. In such an embodiment, one of the Master VR control loop samples may be intermittently replaced by a sample of Vout1 so ADC 101 operates at the same speed. To avoid any issue with a missed sample, in one embodiment, a generated sample is substituted for the skipped sample which may be the previous sample, the next sample or the interpolation between the previous and next samples. In one embodiment, as a maximum, the slave loop or loops is sampled once per switching cycle so giving eight samples for Master and one for slave. In such an embodiment, the net increase in RefClk is 9/8. To avoid any issue with the missed sample, a generated sample is substituted for the skipped sample which may be the previous sample, the next sample or the interpolation between the previous and next samples, according to one embodiment FIG. 4 illustrates master-slave architecture 400 with calibration and time interleaved slow ADC, according to one embodiment of the disclosure. It is pointed out that those elements of FIG. 4 having the same reference numbers (or names) as the elements of any other figure can operate or function in any manner similar to that described, but are not limited to such. So as not to obscure the embodiments, difference between FIGS. 1-2 and FIG. 4 are described.

In one embodiment, instead of time interleaving ADC 101, a slower speed ADC 401 (i.e., slower than ADC 101) is time interleaved with other Slave VRs. In this embodiment, architecture 400 comprises ADC 401, Mux 402, PWM Generator 408, and Bridge and Filter 409 in addition to the components discussed with reference to FIGS. 1-2. In one embodiment, PWM Generator 108 and Bridge and Filter 109 together form Slave VR1, while PWM Generator 408 and Bridge and Filter 409 together form Slave VR2. In another embodiment, PWM Generator 108 and PWM Generator 408 are part of the Master VR as shown. In one embodiment, output PWM2 signal of PWM Generator 408 controls Bridge and Filter 409. In one embodiment, PWM Generator 408 is controlled by dw2 which is a delayed version of VRClk according to the Third Word. In this embodiment, ADC 401 operates at a frequency slower than RefClk (which is operating frequency of ADC 101).

In one embodiment, output of each Slave VR is received by Mux 402 which time interleaves those outputs as Voutm1 (which is output of Mux 402) for ADC 401. In one embodiment, output "d1" of ADC 401 is provided as input to calibration unit 301 which adds calibration error to the word "d1." In one embodiment, Logic Unit 106 receives error signal and the First Word and generates an adjusted Second Word for Digital Delay Line 203. One technical advantage of architecture 400 is that it runs the Master control loop and associated ADC 101 at the fundamental operating frequency so power savings are maximized.

While architecture 400 is illustrated with two Slave VRs which are time interleaved using ADC 401, more Slave VRs may be used. In such an embodiment, a multiple input multiplexer (instead of 2:1 Mux 402) is used, and the select (Sel) signal causes the respective Vouts from the Slave VRs to be provided to ADC 401.

Figure 5:
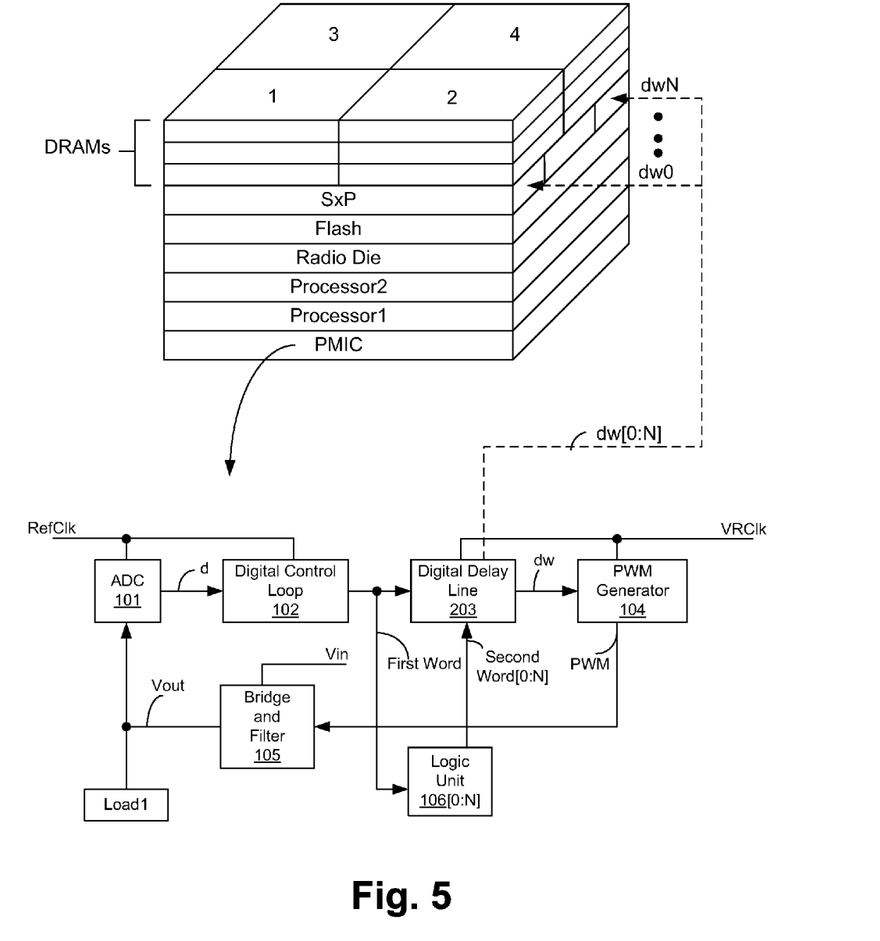
FIG. 5 illustrates a heterogeneous die with master-slave architecture to provide multiple regulated voltages, according to one embodiment of the disclosure.

FIG. 5 illustrates a heterogeneous die 500 with master-slave architecture to provide multiple regulated voltages, according to one embodiment of the disclosure. It is pointed out that those elements of FIG. 5 having the same reference numbers (or names) as the elements of any other figure can operate or function in any manner similar to that described, but are not limited to such.

In one embodiment, heterogeneous die 500 comprises multiple dies stacked together which includes a Power Management Integrated Circuit (PMIC) stacked together with Processor1, Processor2, Radio Die, Flash Memory, SxP (i.e., Phase Change Memory) and Dynamic Random Access Memory (DRAM) modules. In other embodiments, fewer or more dies may be stacked to form heterogeneous die 500. In one embodiment, the stack of dies communicates with one another using Through-Silicon-Vias (TSVs), wire-bonds, or any other technology. In one embodiment, heterogeneous die 500 may use multiple voltage supplies of different voltage levels for different voltage domains. In this example, four voltage domains are shown for the DRAMs.

In one embodiment, PMIC includes the Master VR as described with reference to FIG. 1, 2, 3, or 4. In one embodiment, Master VR generates the reference word (i.e., the First Word). In one embodiment, the First Word is then adjusted by a 'K' factor to generate a plurality of Second Words (Second Word[0:N], where 'N' is an integer). In one embodiment, each of the Second Words is sent to Digital Delay Line 203 which provides respective delay words dw[0:N] (which are delayed versions of VRClk). In one embodiment, the PWM generators and associated Bridge and Filter units of the Slave VR are located near the respective voltage domains. The inductors of the Filter can be on-die or off-die. One technical advantage of such architecture is that analog signals are not transmitted long distances from the Master VR and only digital signals (e.g., dw[0:N]) are transmitted from PMIC to target voltage domains.

In this exemplary embodiment, DRAM stack has independent voltage domains per memory bank. One advantage of the independent voltage domains is that it enables efficient control of power to the DRAM stacks. For example, voltages to banks of DRAMs that are not in use can be reduced while active DRAM banks may receive operating voltages. In one embodiment, each voltage domain has an associated PWM generator. One technical advantage of keeping the PWM generator close to the sink reduces the current density requirement on the power TSVs. While the embodiments are described with reference to one PWM generator per die, each die may also have multiple voltage domains (e.g., voltage domains within Processor1 and/or Processor2). In such an embodiment, multiple PWM generators are located per voltage domain.

Figure 6:
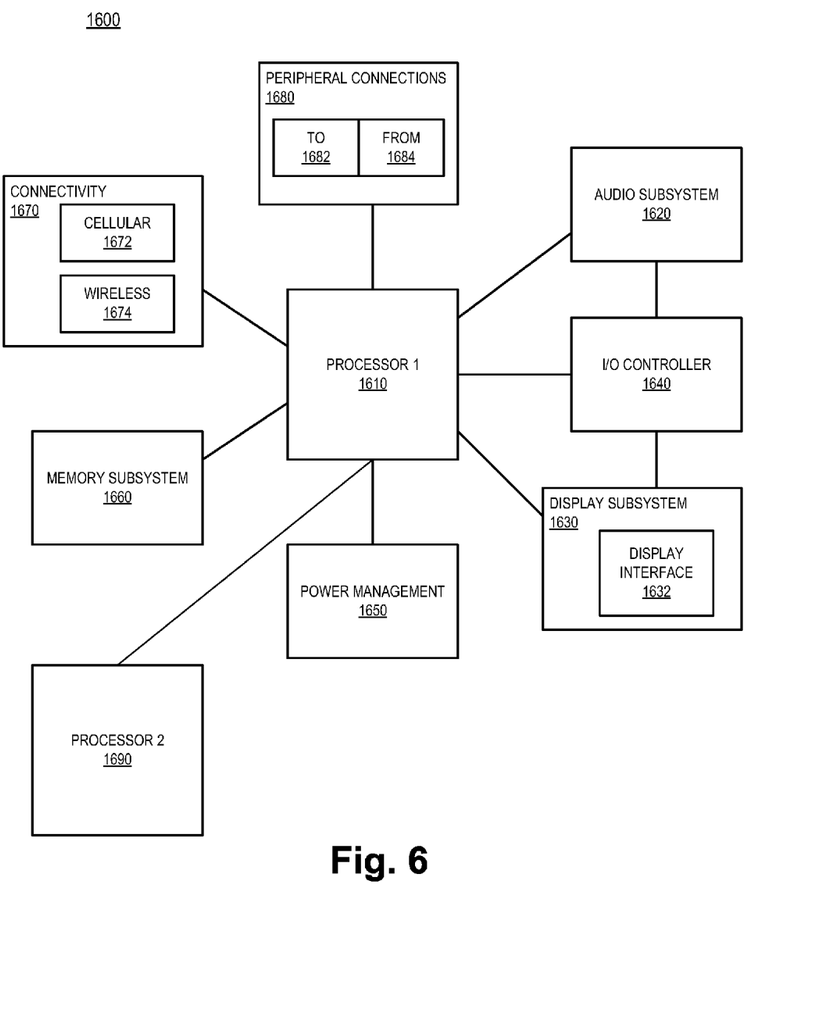
FIG. 6 is a smart device or a computer system or a SoC (System-on-Chip) with master-slave architecture to provide multiple regulated power supplies, according to one embodiment of the disclosure.

FIG. 6 is a smart device or a computer system or a SoC (System-on-Chip) with master-slave architecture to provide multiple regulated power supplies, according to one embodiment of the disclosure. It is pointed out that those elements of FIG. 6 having the same reference numbers (or names) as the elements of any other figure can operate or function in any manner similar to that described, but are not limited to such.

FIG. 6 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 having apparatus with master-slave architecture to provide multiple regulated power supplies described with reference to embodiments. Other blocks of the computing device 1600 may also include apparatus with master-slave architecture to provide multiple regulated power supplies described with reference to embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. Processor 1690 may be optional. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first bridge to be coupled to a first load; a first Pulse Width Modulation (PWM) circuit to drive the first bridge; a second bridge to be coupled to a second load; and a second PWM circuit to drive the second bridge, wherein the first PWM circuit is controlled by a first digital word separate from a second digital word, wherein second PWM circuit is controlled by the second digital word, and wherein the second digital word is derived from the first digital word.

In one embodiment, the apparatus further comprises an Analog-to-Digital converter (ADC) coupled to the first bridge. In one embodiment, the apparatus further comprises a digital controller to generate the first digital word, the digital controller coupled to the ADC. In one embodiment, the apparatus further comprises a first digital delay line to provide a first input to the first PWM circuit, the first digital delay line to control propagation delay of the first input according to the first digital word. In one embodiment, the apparatus further comprises a logic unit to adjust the first delay word and to generate the second delay word.

In one embodiment, the apparatus further comprises a second delay line to provide a second input to the second PWM circuit, the second delay line to control propagation delay of the second input according to the second digital word. In one embodiment, the logic unit to modify a calibration factor of the second digital word, the calibration factor to compensate for systematic offsets associated with the first and second bridges. In one embodiment, the ADC is time interleaved with the first and second bridges. In one embodiment, the apparatus further comprises another ADC coupled to the second bridge, the other ADC to operate at a frequency slower than a frequency of the ADC.

In one embodiment, the apparatus further comprises a digital delay line to provide first and second inputs to the first and second PWM circuits respectively, wherein the digital delay line to control propagation delay of the first input according to the first digital word, and wherein the digital delay line to control propagation delay of the second input according to the second digital word. In one embodiment, the first digital word is different than the second digital word. In one embodiment, the first digital word is identical to the second digital word.

In another example, a system is provided which comprises: a memory unit; and a processor coupled to the memory unit, the processor including a distributed voltage regulator according to the apparatus discussed above. In one embodiment, the system further comprises: a wireless interface for communicatively coupling the processor with another device. In one embodiment, the system further comprises a display unit. In one embodiment, the display unit is a touch screen.

In another example, a stacked die is provided which comprises: a first die comprising a first processor; a second die comprising: a second processor, the second processor stacked on the first processor and communicatively coupled to the first processor by through silicon vias (TSVs); a first bridge; a second bridge; a first Pulse Width Modulation (PWM) circuit to drive the first bridge; and a second PWM circuit to drive the second bridge, wherein the first PWM circuit is controlled by a first digital word separate from a second digital word, wherein the second PWM circuit is controlled by the second digital word, and wherein the second digital word is derived from the first digital word; and a memory die coupled to the second die, the memory die having first and second voltage domains, wherein the first bridge to drive power supply for the first voltage domain, and wherein the second bridge to drive a second power supply for the second voltage domain.

In one embodiment, the stacked die further comprises power management die coupled to the first die, the power management die comprising an Analog-to-Digital converter (ADC). In one embodiment, the power management die comprises a digital controller to generate the first digital word, the digital controller coupled to the ADC. In one embodiment, the power management die further comprises a first digital delay line to provide a first input to the first PWM circuit, the first digital delay line to control propagation delay of the first input according to the first digital word. In one embodiment, the power management die further comprises a logic unit to adjust the first delay word and to generate the second delay word. In one embodiment, the power management die further comprises a second delay line to provide a second input to the second PWM circuit, the second delay line to control propagation delay of the second input according to the second digital word.

In another example, a system is provided which comprises: a memory unit; and a processor coupled to the memory unit, the processor including a stacked die according to the stacked die discussed above. In one embodiment, the system further comprises: a wireless interface for communicatively coupling the processor with another device. In one embodiment, the system further comprises a display unit. In one embodiment, the display unit is a touch screen.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first bridge to be coupled to a first load;
   a first Pulse Width Modulation (PWM) circuit to drive the first bridge;
   a second bridge to be coupled to a second load;
   a second PWM circuit to drive the second bridge, and
   a logic unit to adjust the first delay word and to generate the second delay word, wherein the first PWM circuit is controlled by a first digital word separate from a second digital word, wherein second PWM circuit is controlled by the second digital word, wherein the second digital word is derived from the first digital word, and wherein the logic unit is operable to modify a calibration factor of the second digital word, the calibration factor to compensate for systematic offsets associated with the first and second bridges.

2. The apparatus of claim 1 further comprises an Analog-to-Digital converter (ADC) coupled to the first bridge.

3. The apparatus of claim 2 further comprises a digital controller to generate the first digital word, the digital controller coupled to the ADC.

4. The apparatus of claim 3 further comprises a first digital delay line to provide a first input to the first PWM circuit, the first digital delay line to control propagation delay of the first input according to the first digital word.

5. The apparatus of claim 1 further comprises a second delay line to provide a second input to the second PWM circuit, the second delay line to control propagation delay of the second input according to the second digital word.

6. The apparatus of claim 2, wherein the ADC is time interleaved with the first and second bridges.

7. The apparatus of claim 2 further comprises another ADC coupled to the second bridge, the other ADC to operate at a frequency slower than a frequency of the ADC.

8. An apparatus comprising:
a first bridge to be coupled to a first load;
a first Pulse Width Modulation (PWM) circuit to drive the first bridge;
a second bridge to be coupled to a second load;
a second PWM circuit to drive the second bridge; and
a digital delay line to provide first and second inputs to the first and second PWM circuits respectively, wherein the first PWM circuit is controlled by a first digital word separate from a second digital word, wherein the second PWM circuit is controlled by the second digital word, wherein the second digital word is derived from the first digital word, wherein the digital delay line is operable to control propagation delay of the first input according to the first digital word, and wherein the digital delay line is operable to control propagation delay of the second input according to the second digital word.

9. The apparatus of claim 1, wherein the first digital word is different than the second digital word.

10. The apparatus of claim 1, wherein the first digital word is identical to the second digital word.

11. A system comprising:
a memory unit;
a processor coupled to the memory unit, the processor including a distributed voltage regulator comprising:
  a first bridge to be coupled to a first load;
  a first Pulse Width Modulation (PWM) circuit to drive the first bridge;
  a second bridge to be coupled to a second load;
  a second PWM circuit to drive the second bridge; and
  a logic unit to adjust the first delay word and to generate the second delay word, wherein the first PWM circuit is controlled by a first digital word separate from a second digital word, wherein the second PWM signal is controlled by the second digital word, wherein the second digital word is derived from the first digital word, and wherein the logic unit is operable to modify a calibration factor of the second digital word, the calibration factor to compensate for systematic offsets associated with the first and second bridges; and
a wireless interface for communicatively coupling the processor with another device.

* * * * *